(12) United States Patent
Hayashi et al.

(10) Patent No.: US 8,198,199 B2
(45) Date of Patent: Jun. 12, 2012

(54) EPITAXIAL FILM, PIEZOELECTRIC ELEMENT, FERROELECTRIC ELEMENT, MANUFACTURING METHODS OF THE SAME, AND LIQUID DISCHARGE HEAD

(75) Inventors: Jumpei Hayashi, Yokohama (JP); Takanori Matsuda, Chofu (JP); Tetsuro Fukui, Yokohama (JP); Hiroshi Funakubo, Yokohama (JP)

(73) Assignees: Canon Kabushiki Kaisha, Tokyo (JP); Tokyo Institute of Technology, Tokyo (JP)

( * ) Notice: Subject to any disclaimer, the term of this patent is extended or adjusted under 35 U.S.C. 154(b) by 471 days.

(21) Appl. No.: 12/526,308

(22) PCT Filed: Mar. 5, 2008

(86) PCT No.: PCT/JP2008/054425
§ 371 (c)(1),
(2), (4) Date: Aug. 7, 2009

(87) PCT Pub. No.: WO2008/126575
PCT Pub. Date: Oct. 23, 2008

(65) Prior Publication Data
US 2010/0052113 A1    Mar. 4, 2010

(30) Foreign Application Priority Data

Mar. 30, 2007    (JP) .................................. 2007-094116

(51) Int. Cl.
 *H01L 21/31*    (2006.01)
(52) U.S. Cl. . 438/758; 438/785; 257/627; 257/E27.006; 257/E29.004; 257/E21.01; 257/E21.211
(58) Field of Classification Search .................. 438/758, 438/785; 257/627, E27.006, E29.004, E21.01, 257/E21.211
See application file for complete search history.

(56) References Cited

U.S. PATENT DOCUMENTS
5,753,934 A    5/1998    Yano et al. ...................... 257/30
(Continued)

FOREIGN PATENT DOCUMENTS
CN    1636729 A    7/2005
(Continued)

OTHER PUBLICATIONS

Horita Susuma et al., "Increase of Dielectric Constant of an Epitaxial (100) Yttria-Stablilized Zirconia Film on (100) si Substrate Deposited by Reactive Sputtering in the Metallic Mode", Jpn. J. Appl. Phys., vol. 40, 2001, pp. 6547-6551.

(Continued)

*Primary Examiner* — Tu-Tu Ho
(74) *Attorney, Agent, or Firm* — Fitzpatrick, Cella, Harper & Scinto (57)    ABSTRACT

There are disclosed an epitaxial film, comprising: heating an Si substrate provided with an $SiO_2$ layer with a film thickness of 1.0 nm or more to 10 nm or less on a surface of the substrate; and
forming on the $SiO_2$ layer by use of a metal target represented by the following composition formula:

$$yA(1-y)B \qquad (1),$$

in which A is one or more elements selected from the group consisting of rare earth elements including Y and Sc, B is Zr, and y is a numeric value of 0.03 or more to 0.20 or less, the epitaxial film represented by the following composition formula:

$$xA_2O_3\text{-}(1-x)BO_2 \qquad (2),$$

in which A and B are respectively same elements as A and B of the composition formula (1), and x is a numeric value of 0.010 or more to 0.035 or less.

15 Claims, 4 Drawing Sheets

U.S. PATENT DOCUMENTS

| | | | |
|---|---|---|---|
| 6,232,242 B1 | 5/2001 | Hata et al. | 438/762 |
| 7,636,994 B2 * | 12/2009 | Tochi et al. | 29/25.35 |
| 2002/0140320 A1 | 10/2002 | Unno et al. | 310/328 |
| 2005/0168112 A1 | 8/2005 | Aoki et al. | |

FOREIGN PATENT DOCUMENTS

| | | |
|---|---|---|
| EP | 1560278 | 8/2005 |
| JP | H02-082585 | 3/1990 |
| JP | H09-110592 | 4/1997 |
| JP | 2002-234156 | 8/2002 |

OTHER PUBLICATIONS

Horita Susuma et al., "Heteroepitaxial Growth of Yttria-Stabilized Zirconia Film on Silicon by Reactive Sputtering". Jpn. J. Appl. Phys., vol. 34, 1995, pp. 1942-1946.

Kiguchi, Takanori, et al., "Role of Ultra Thin SiOx Layer on Epitaxial YSZ/SiOx/Si Thin Film", Integrated Ferroelectrics, vol. 51, 2003, pp. 51-61.

International Preliminary Report on Patentability in PCT/JP2008/054425 dated Oct. 15, 2009—12 pages.

* cited by examiner

EPITAXIAL FILM, PIEZOELECTRIC ELEMENT, FERROELECTRIC ELEMENT, MANUFACTURING METHODS OF THE SAME, AND LIQUID DISCHARGE HEAD

TECHNICAL FIELD

The present invention relates to an epitaxial film preferable for a buffer layer for preparing an electronic device to be formed on an Si substrate, a piezoelectric element and a ferroelectric element using the epitaxial film, manufacturing methods thereof, and a liquid discharge head.

BACKGROUND ART

An Si substrate which is a semiconductor single crystal substrate has excellent crystallinity, and an area of the substrate can be enlarged, so that the substrate is suitable as a substrate to prepare an electronic device, and is used for a general purpose. Examples of the electronic device to be laminated and prepared on the Si substrate include a dielectric device, a piezoelectric device, a ferroelectric device and a pyroelectric device. A buffer layer as an underlayer to be formed on the Si substrate in order to improve a crystal structure of the device has been investigated.

In the buffer layer, as a material excellent in lattice matching with Si crystals of the substrate and lattice matching with crystals of a perovskite oxide constituting the electronic device, $ZrO_2$ formed into an epitaxial film, or stabilized $ZrO_2$ doped with Y is used.

As such a buffer layer, specifically there are reported a laminated thin film (Patent Document 1) using a thin film of zirconium oxide or stabilized zirconium oxide stabilized with Y, and a piezoelectric element (Patent Document 2) using Y-stabilized zirconia (YSZ).

However, in the buffer layer disclosed in Patent Document 1, laminated films having crystal surfaces thereof aligned with the surface of the substrate are formed by an electronic beam evaporation process, and this is not suitable for forming films having a large area. Therefore, establishment of such a film forming technology as to form the buffer layer having the large area is demanded.

Moreover, the buffer layer obtained as a conventional epitaxial film has a large content of rare earth elements including Sc and Y in stabilized $ZrO_2$. In addition, when the film having a large area of 3 inches or more is formed, there is a problem that fluctuations of an in-plane composition increase. For example, a content of Y in a bulk single crystal of $Y_2O_3$—$ZrO_2$ is 3.7% at maximum, whereas a content of Y in the epitaxial film is 10% or more. It is difficult to reduce the content of Y in the resultant film. In general, when the film is formed by a sputtering process, a composition of a target is not reflected in that of the epitaxial film as it is, and it is very difficult to find an optimum composition of the target for obtaining the epitaxial film having a targeted composition.

Therefore, the epitaxial film containing excessive yttrium oxide with respect to zirconium oxide has a crystal of tetragonal system attributed to $Y_2O_3$, and (100) orientation and (001) orientation are mixedly present in the film. The thin film having single crystallinity is not obtained.

It is to be noted that in Example 1 of Patent Document 3, "an epitaxially grown film of $(Y_2O_3)x(ZrO_2)1-x$ (x=0.04) on the Si substrate" is disclosed.

(Patent Document 1) Japanese Patent Application Laid-Open No. H09-110592

(Patent Document 2) Japanese Patent Application Laid-Open No. 2002-234156

(Patent Document 3) Japanese Patent Application Laid-Open No. H02-082585

DISCLOSURE OF THE INVENTION

An object of the present invention is to provide a large-area epitaxial film having a uniform composition and excellent crystal orientation, and a manufacturing method of the film. A further object of the present invention is to provide a piezoelectric element in which an epitaxial film excellent in lattice matching is used as a buffer layer on an Si substrate to provide a single oriented crystal structure and which has excellent characteristics and a large area and to provide a ferroelectric element using the epitaxial film and to provide manufacturing methods of the elements. A still further object of the present invention is to provide a large liquid discharge head in which these elements are used and which has an excellent liquid discharge performance.

To solve the above problems, the present inventors have intensively investigated an Si substrate on which an epitaxial film is laminated, a composition of a target material for use in forming the epitaxial film by a sputtering process, and a correlation with a composition of the resultant epitaxial film. As a result, it has been found that an epitaxial film in which a metal element is uniformly distributed and which has single oriented crystallinity and a large area can be formed on an Si substrate having an $SiO_2$ layer with a specific thickness on the surface of the substrate by sputtering of a metal as a target material including the metal element at a specific ratio. The present invention has been completed based on such finding.

That is, the present invention is directed to a manufacturing method of an epitaxial film, comprising: heating an Si substrate provided with an $SiO_2$ layer with a film thickness of 1.0 nm or more to 10 nm or less on a surface of the substrate; and forming on the $SiO_2$ layer by use of a metal target represented by the following composition formula:

$$yA(1-y)B \quad (1),$$

in which A is one or more elements selected from the group consisting of rare earth elements including Y and Sc, B is Zr, and y is a numeric value of 0.03 or more to 0.20 or less, the epitaxial film represented by the following composition formula:

$$xA_2O_3\text{-}(1-x)BO_2 \quad (2),$$

in which A and B are respectively same elements as A and B of the composition formula (1), and x is a numeric value of 0.010 or more to 0.035 or less.

Moreover, the present invention is directed to an epitaxial film which is formed on an Si substrate and which is represented by a composition formula:

$$xA_2O_3\text{-}(1-x)BO_2 \quad (2),$$

in which A is an element including at least one of rare earth elements such as Y and Sc, B is Zr, and x is a numeric value of 0.010 or more to 0.035 or less.

Furthermore, the present invention is directed to a piezoelectric element having a first electrode layer, a piezoelectric layer and a second electrode layer in this order on an Si substrate, the piezoelectric element further comprising, between the Si substrate and the first electrode layer, an epitaxial film represented by the following composition formula:

$$xA_2O_3\text{-}(1-x)BO_2 \quad (2),$$

in which A is one or more atoms of elements selected from the group consisting of rare earth elements such as Y and Sc, B is Zr, and x is a numeric value of 0.010 or more to 0.035 or less.

In addition, the present invention is directed to a ferroelectric element having a first electrode layer, a ferroelectric layer and a second electrode layer in this order on an Si substrate, the ferroelectric element further comprising, between the Si substrate and the first electrode layer, an epitaxial film represented by a composition formula:

$$xA_2O_3-(1-x)BO_2 \qquad (2),$$

in which A is an element including at least one of rare earth elements such as Y and Sc, B is Zr, and x is a numeric value of 0.010 or more to 0.035 or less.

Moreover, the present invention is directed to a liquid discharge head having the above piezoelectric element and adapted to discharge a liquid by use of the piezoelectric element.

The epitaxial film of the present invention having a uniform composition, a single oriented crystal structure and a large area can be prepared.

Moreover, according to the manufacturing method of the epitaxial film of the present invention, the epitaxial film having a uniform composition, a single oriented crystal structure and a large area can easily be manufactured.

Furthermore, in the piezoelectric element and the ferroelectric element of the present invention, the epitaxial film excellent in lattice matching is used as a buffer layer on the Si substrate. In consequence, the element having a single oriented crystal structure, excellent characteristics and a large area can be prepared.

Moreover, according to a manufacturing method of the element of the present invention, the element having a single oriented crystal structure in which the metal element is uniformly distributed and having a large area can easily be manufactured.

In the liquid discharge head of the present invention, a high resolution can be obtained, and a liquid can be discharged at a high speed. A large amount of liquid can be discharged even with a high density of the head, and the head can be enlarged.

Further features of the present invention will become apparent from the following description of exemplary embodiments with reference to the attached drawings.

BEST MODE FOR CARRYING OUT THE INVENTION (Manufacturing Method of Epitaxial Film)

A manufacturing method of an epitaxial film according to the present invention is characterized by heating an Si substrate including an $SiO_2$ layer having a film thickness of 1.0 nm or more to 10 nm or less on the surface of the substrate by use of a metal target represented by a composition formula (1); and forming, on the substrate, the epitaxial film represented by a composition formula (2).

The metal target for use in the manufacturing method of the epitaxial film according to the present invention is represented by the following composition formula $$yA-(1-y)B \qquad (1),$$

in which A is one or more atoms of elements selected from the group consisting of rare earth elements such as Y and Sc, B is Zr, and y is a numeric value of 0.03 or more to 0.20 or less. The epitaxial film having a composition represented by the composition formula (2) as a targeted composition can be obtained using the target of the above composition.

Specific examples of the metal elements represented by A of the composition formula (1) include Sc, Y, La, Ce, Pr, Nd, Pm, Sm, Gd, Dy, Yb, Lu and Eu, and are preferably Y, La, Ce and Dy.

Assuming that the total number of the metal elements in the metal target is 1, the number of the metal elements represented by A in the metal target, that is, y of the composition formula (1) is 0.03 or more to 0.20 or less. When the number of the metal elements in the metal target is 1 and the number of the elements A included in the metal target is 0.03 or more, x of the composition formula (2) is 0.01 or more in the epitaxial film. In this case, a content of the metal elements A is appropriate, and a stable film having excellent crystallinity can be obtained. When the number of the metal elements in the metal target is 1 and the number of the elements A included in the metal target is 0.20 or less, the metal target can easily be prepared, and the epitaxial film having a uniform composition can be obtained.

As the metal target having such a composition, an alloy target (a kneaded metal target) can be used. The alloy target can be prepared by mixing the elements A, B of the composition formula (1) at an element composition ratio of y, 1−y, and melting this compositions in vacuum. As the epitaxial film, a good-quality film having less composition fluctuations, less film thickness fluctuations and excellent crystallinity can be obtained using the target obtained by eliminating mixture of impurities. The metal target can be subjected to sputtering for cleaning of the surface, so-called pre-sputtering after installation of a sputtering unit and before the formation of the epitaxial film.

The Si substrate for use in the manufacturing method of the epitaxial film according to the present invention preferably has a single crystal structure, because the epitaxial film having a single oriented structure is easily formed on the substrate. The surface of the Si substrate having the single crystal structure can have (100) orientation. Even when an SOI substrate is used as the Si substrate, the substrate surface can have a (100) orientation single crystal structure. When the substrate has a handle layer, the handle layer may have a (110) crystal structure.

The surface of such an Si substrate has, on the surface thereof, an $SiO_2$ layer having a film thickness of 1.0 nm or more to 10 nm or less. The Si substrate has the $SiO_2$ layer having such a film thickness, whereby the epitaxial film of an oxide of the metal element subjected to the sputtering of the target can be formed on the Si substrate. The film has excellent crystallinity, and has the above composition. When the $SiO_2$ layer has a film thickness of 1.0 nm or less, the epitaxial film having a uniform composition and improved crystallinity is obtained. The epitaxial film having excellent crystallinity can be formed even on the Si substrate having a large area.

When the SiO$_2$ layer has a film thickness of 10 nm or less, time required for an initial film forming step can be reduced, and a substrate temperature can be raised in a short time. Moreover, productivity of the epitaxial film can be inhibited from lowering. The SiO$_2$ layer can have a film thickness of 1.0 nm or more to 5.0 nm or less.

The surface of the Si substrate is treated with buffered hydrofluoric acid to remove impurities attached to the surface of the SiO$_2$ layer, and then the SiO$_2$ layer can be formed into a desired film thickness by an oxidation treatment such as an ammoniacal peroxide water treatment or a hydrochloric acid peroxide water treatment.

Here, as the film thickness of the SiO$_2$ layer, a value measured with a spectroscopic ellipsometry (UVISEL manufactured by JOBIN YVON Co.) may be used.

The epitaxial film is formed on the Si substrate by a sputtering process. In the sputtering process, accelerated particles are allowed to collide with the target, and the metal elements of the target are discharged to a space, guided onto the substrate, bonded to each other, and bonded to the substrate, thereby forming the epitaxial film on the substrate. Examples of the sputtering process include radio frequency sputtering, direct-current sputtering, magnetron sputtering, ion beam sputtering and chemical conversion sputtering, and the radio frequency sputtering is preferably used. To form the epitaxial film by the sputtering process, a well-known sputtering system may be used.

As conditions of the sputtering process, during initial formation of the epitaxial film immediately after start of the film formation, an oxygen-containing gas is not used, an inert gas such as Ar can be used, and a gas pressure is set to preferably 0.1 Pa or more to 1.0 Pa or less, more preferably 0.1 Pa or more to 0.9 Pa or less. A sputtering power is preferably set to 1 W/cm$^2$ or more to 5 W/cm$^2$ or less. Here, the initial formation of the epitaxial film immediately after the start of the film formation corresponds to 1 to 500 seconds, more preferably 1 to 250 seconds from the start of the film formation, depending on the film forming conditions. During the initial formation of the epitaxial film immediately after the start of the film formation, the oxygen-containing gas is not used, whereby the film thickness of the epitaxial film formed on the Si substrate can be controlled. In a competitive reaction between epitaxial growth and oxidation, the crystallinity can be prevented from being disturbed. Specifically, a partial oxygen pressure is preferably 1×10$^{-4}$ Pa or less, more preferably 1×10$^{-5}$ Pa.

After the initial formation of the epitaxial film, the oxygen-containing gas can be used, so that the epitaxial film having a large film thickness can efficiently be formed. Specifically, a mixture gas in which O$_2$ and Ar are mixed at an appropriate ratio is used, and a sputtering power is set to preferably 5 W/cm$^2$ or more to 10 W/cm$^2$ or less with a gas pressure equal to the above pressure.

A temperature of the substrate is set to preferably 400° C. or more to 760° C. or less, more preferably 400° C. or more to 640° C. or less. The substrate temperature may be measured with a substrate embedded type thermocouple. The substrate is set to a constant temperature, and then the film formation is started, whereby the epitaxial film having the single oriented crystal structure can be formed.

The epitaxial film formed on the Si substrate by the sputtering process is a stabilized oxide represented by the following composition formula $$xA_2O_3\text{-}(1-x)BO_2 \qquad (2),$$

in which A and B are the same atoms of the metal elements as those of the composition formula (1), and x is a numeric value of 0.010 or more to 0.035 or less. In the composition formula (2), x is 0.035 or less, whereby a tetragonal crystal axis c/a ratio comes close to 1.0, and crystallinity of the film improves. When x is 0.01 or more and the oxide represented by A$_2$O$_3$ is present, an unstable state without Curie temperature can be avoided.

In the composition formula (2), A is an element including at least one of rare earth elements such as Y and Sc. Specifically, the element is similar to that illustrated in the above composition formula (1). In the composition formula (2), B is Zr. Furthermore, when A is Y and B is Zr in the composition formula (2), the epitaxial film includes ZrO$_2$ stabilized with Y$_2$O$_3$, and has a crystal structure having a lattice constant of 0.515 nm or more to 0.518 nm or less. The epitaxial film of such a stabilized oxide is a bulk single crystal of YSZ, and has a difference in a range of 0.3 to 0.4% from a lattice constant 0.516 nm of 0.037Y$_2$O$_{3-0.963}$ZrO$_2$. Therefore, even when the epitaxial film has a small stress within the film and is formed into a large area, generation of warp of the substrate can be suppressed. Various devices each having a large area can be laminated on the epitaxial film. That is, a film having excellent crystallinity can be formed on this epitaxial film.

The epitaxial film has a film thickness of preferably 1.0 nm or more to 500 nm or less. When the film thickness is 1.0 nm or less, orientation of a piezoelectric layer and a ferroelectric layer provided on the epitaxial film is easily controlled. When the film thickness is 500 nm or less, film formation time can be inhibited from being lengthened, and the devices can efficiently be prepared.

Moreover, in the epitaxial film having the above film thickness, a peak intensity of Y$_2$O$_3$—ZrO$_2$ (200) orientation measured by X-ray diffraction (XRD) is 8000 cps or more, and a full width at half maximum of the peak is 0.8° or less. When an electrode layer and the piezoelectric layer are laminated on this epitaxial film, the peak intensity measured by the XRD decreases. However, when the piezoelectric layer having a film thickness of, for example, about 3 µm is provided, the peak intensity of the (200) orientation of the epitaxial film is 200 cps or more. On such an epitaxial film, a dielectric layer, the piezoelectric layer and the ferroelectric layer having excellent crystallinity can stably be provided.

A piezoelectric element of the present invention has a first electrode layer, a piezoelectric layer and a second electrode layer in this order on an Si substrate, and the piezoelectric element has, between the Si substrate and the first electrode layer, an epitaxial film represented by the following composition formula:

$$xA_2O_3\text{-}(1-x)BO_2 \qquad (2),$$

in which A is one or more atoms of elements selected from the group consisting of rare earth elements such as Y and Sc, B is Zr, and x is a numeric value of 0.010 or more to 0.035 or less.

In the piezoelectric element of the present invention, the Si substrate and the epitaxial film provided on the Si substrate are similar to those described above, and the epitaxial film functions as a buffer layer.

In the first and second electrode layers of the piezoelectric element, a metal or a conductive oxide is used. Examples of the metal include Pt, Ir, Ru, Au, Ni, Al and W. Among them, a face-centered cubic metal such as Pt, Ir, Au, Ni or Al is especially preferably used. Examples of the conductive oxide include IrO$_2$, RuO$_2$, RbO$_2$, La—SrTiO$_3$, SrRuO$_3$ and LaNiO$_3$. The first and second electrode layers may be formed of the same material or different materials. The first electrode layer preferably includes the conductive oxide.

To form the above electrode layers, the epitaxial film is formed, and then the electrode layers are preferably continuously formed in the same chamber without being exposed to air. In consequence, an orientation film or a single crystal film can be formed in a state in which excellent crystallinity is maintained.

A buffer layer of a different composition, for example, fluoric oxide may be provided between the buffer layer and the electrode layer of the epitaxial film represented by the composition formula (2).

In the piezoelectric layer of the piezoelectric element, an $ABO_3$ perovskite oxide may be used. The piezoelectric layer preferably has, with respect to the Si substrate, a crystal structure of (100) orientation, (001) orientation, (110) orientation, (111) orientation, or orientation in which the (100) orientation and the (001) orientation are mixedly present. The piezoelectric layer is provided with the (100) orientation, the (001) orientation or the orientation in which the (100) orientation and the (001) orientation are mixedly present as follows. That is, fluoric oxide, preferably $CeO_2$ is formed into an epitaxial film on the above epitaxial film. Subsequently, an electrode layer of an oxide having a laminated structure such as $SrRuO_3/LaNiO_3$ is provided, and the piezoelectric layer may be provided on $SrRuO_3$.

Moreover, to form the piezoelectric layer having the (110) orientation, the electrode layer of the $ABO_3$ perovskite oxide is directly epitaxially grown on the epitaxial film to obtain the electrode layer of the (110) orientation, and the piezoelectric layer may be formed. An $ABO_3$ perovskite oxide similar to that described above may preferably be used in the electrode layer. To form the piezoelectric layer of the (111) orientation, an electrode layer of a metal, preferably the face-centered cubic metal is formed on the epitaxial film, and then the piezoelectric layer may be formed. As the electrode layer, an oxide such as $SrRuO_3$ may be laminated on the metal. As the piezoelectric layer of the above orientation, a conductive material such as PZT, PMN, PNN, PSN, PMN-PT, PNN-PT, PSN-PT, PZN-PT or BTO may be used.

The piezoelectric element has the buffer layer of the epitaxial film having excellent crystallinity, so that the element has the excellent crystallinity of a single crystal structure or a single oriented crystal structure. Therefore, a piezoelectric material can be selected to form the piezoelectric element having the excellent crystallinity. The piezoelectric element has desired crystal orientation, and in-plane orientation also has a high degree of orientation in a film thickness direction.

The piezoelectric element can be manufactured by forming the epitaxial film on the Si substrate, and then successively providing the first electrode layer, the piezoelectric layer and the second electrode layer. As an example of a manufacturing method of such a piezoelectric element, a deposited film forming technology for use in a semiconductor manufacturing process may be applied.

Examples of a method for forming the first electrode layer include a sputtering process and a sol-gel process. Examples of a method for forming the piezoelectric layer include the sputtering process, the sol-gel process, a CVD process, an EB process and an evaporation process. Examples of a method for forming the second electrode layer include a coating process, the evaporation process and the sputtering process.

A ferroelectric element of the present invention has a first electrode layer, a ferroelectric layer and a second electrode layer in this order on an Si substrate, and the ferroelectric element further has, between the Si substrate and the first electrode layer, an epitaxial film represented by the following composition formula:

$$xA_2O_3-(1-x)BO_2 \qquad (2),$$

in which A is one or more atoms of elements selected from the group consisting of rare earth elements such as Y and Sc, B is Zr, and x is a numeric value of 0.010 or more to 0.035 or less.

Specifically, the Si substrate, and the epitaxial film and the first and second electrode layers provided on the Si substrate in the ferroelectric element of the present invention may be similar to those in the piezoelectric element described above, and can be obtained by a method similar to the above method.

The $ABO_3$ perovskite oxide may be used in the ferroelectric layer of the ferroelectric element. The ferroelectric layer having a crystal structure of the (111) orientation with respect to the Si substrate is preferably used. Specifically, the ferroelectric layer having the crystal structure of the (111) orientation may be similar to the piezoelectric layer of the (111) orientation. Such a ferroelectric layer can be formed by a method similar to the method for forming the piezoelectric layer of the piezoelectric element.

In the ferroelectric element of the present invention, the ferroelectric layer is formed on the Si substrate via the buffer layer including the epitaxial film having excellent crystallinity, so that the ferroelectric layer has excellent crystallinity and satisfactory durability.

There is not any special restriction on a liquid discharge head of the present invention, as long as the head has the above piezoelectric element. Specifically, the head has a discharge port which discharges a liquid, an individual liquid chamber which communicates with the discharge port, a vibration plate constituting a part of the individual liquid chamber, and the piezoelectric element which applies vibration to the vibration plate provided outside the individual liquid chamber. In such a liquid discharge head, the liquid of the individual liquid chamber is discharged from the discharge port owing to a volume change in the individual liquid chamber generated by the vibration plate.

In the liquid discharge head, the piezoelectric element having the buffer layer including the epitaxial film is used, whereby the head having a uniform and high discharge performance, excellent durability and a large size can easily be obtained. The liquid discharge head can be used in an image forming device such as an ink discharge printer, a facsimile machine, a complex machine, a photocopier, or an industrial discharge device which discharges a liquid other than ink.

Figure 1:
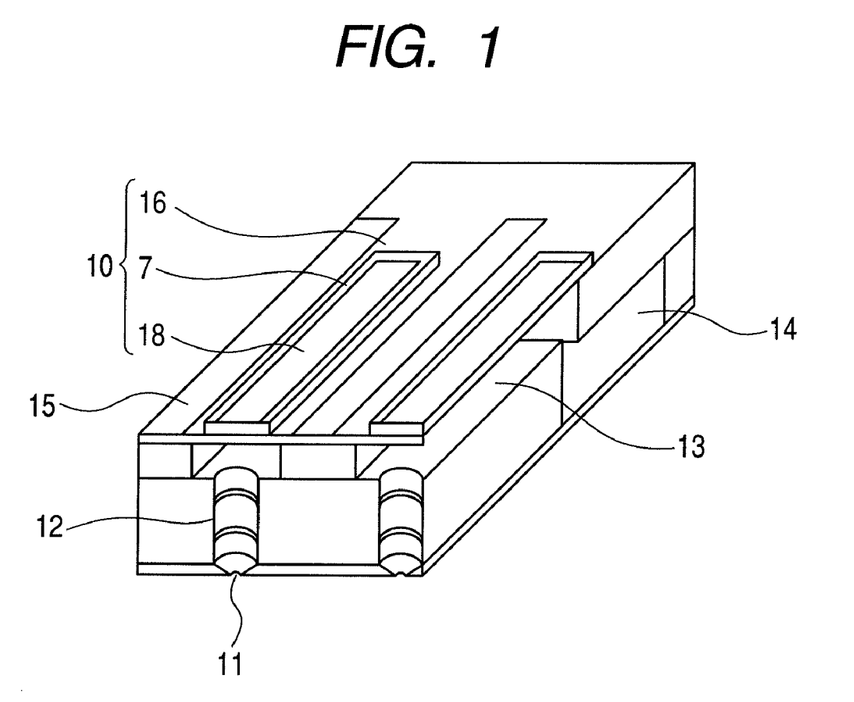
FIG. 1 is a schematic constitution diagram showing one example of a liquid discharge head according to the present invention.
Figure 2:
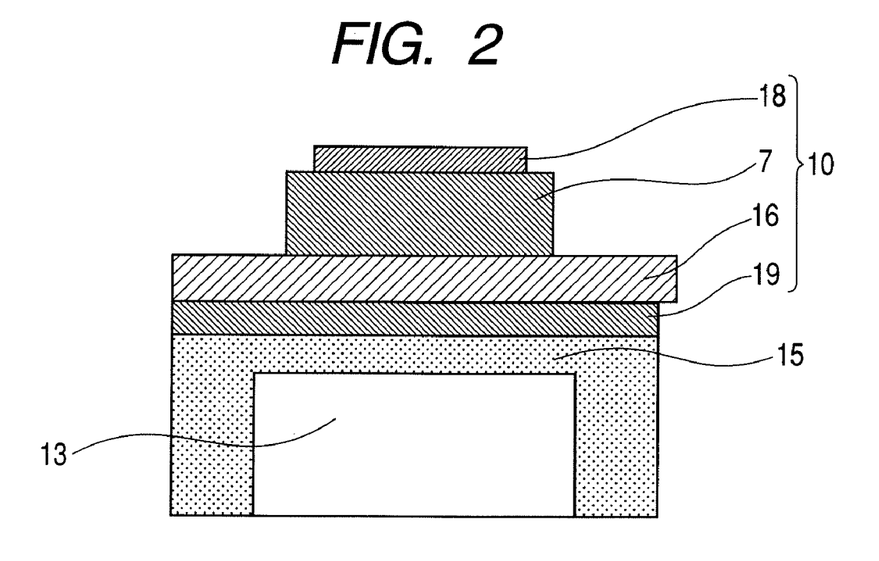
FIG. 2 is a schematic diagram showing one example of a piezoelectric element of the present invention.

One example of the liquid discharge head according to the present invention will be described with reference to FIG. 1. The liquid discharge head shown in FIG. 1 includes discharge ports 11 which discharge a liquid, communication holes 12 which allow the discharge ports 11 to communicate with individual liquid chambers 13, and a common liquid chamber 14 which supplies the liquid to the individual liquid chambers 13. A part of each individual liquid chamber 13 includes a vibration plate 15, and a piezoelectric element 10 which applies vibration to the vibration plate 15 is provided on the vibration plate 15. As shown in a schematic sectional view of FIG. 2, the piezoelectric element 10 has a structure in which a buffer layer 19 including the above-mentioned epitaxial film, a first electrode layer 16, a piezoelectric layer 7 and a second electrode layer 18 are successively laminated on the vibration plate 15 corresponding to an Si substrate. The piezoelectric element 10 has a rectangular shape, but may have a trapezoidal shape or an inverted trapezoidal shape.

Figure 3:
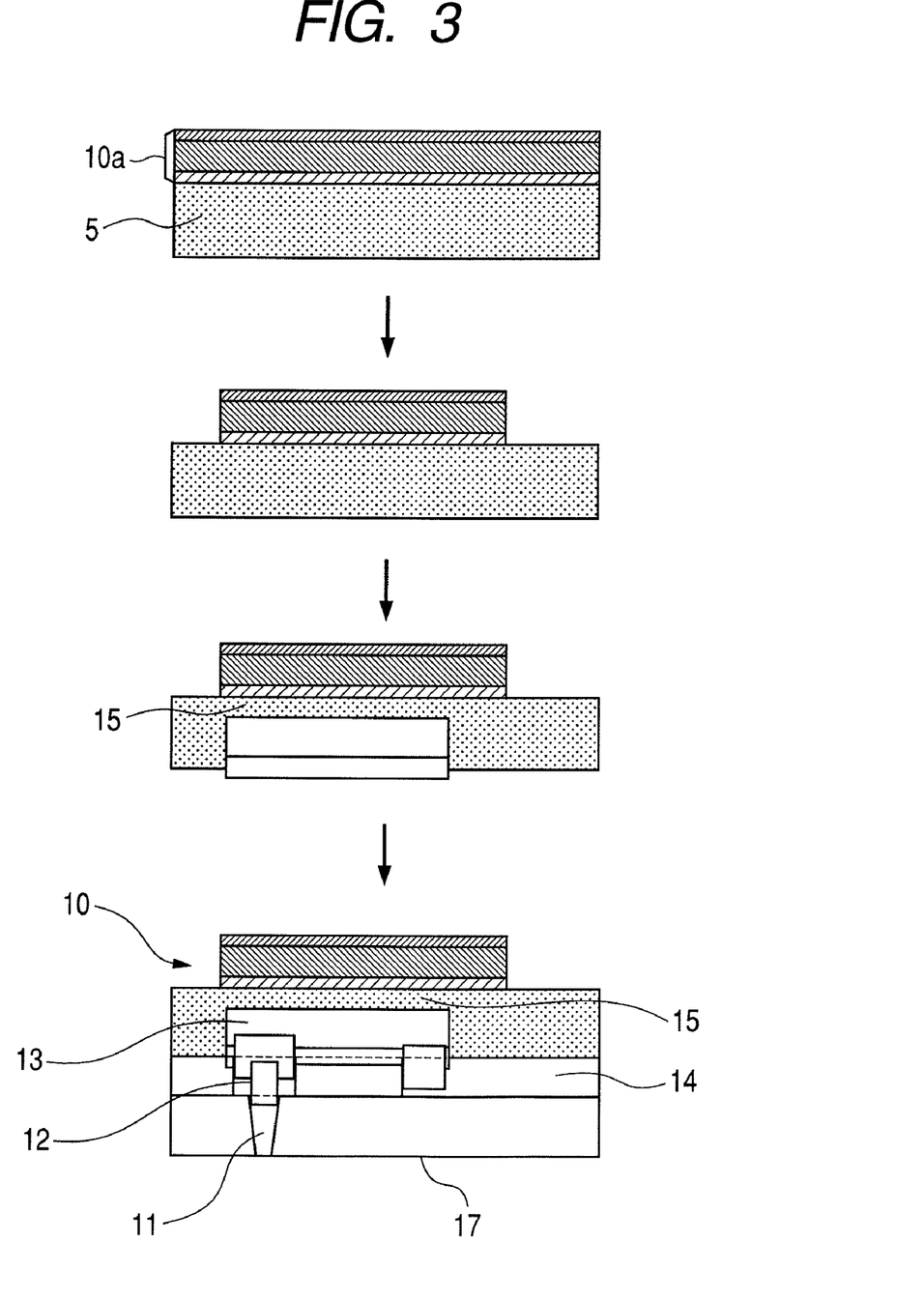
FIG. 3 is a step diagram showing a manufacturing method of the liquid discharge head according to the present invention.

One example of a manufacturing method of such a liquid discharge head will be described with reference to a step diagram of FIG. 3. A piezoelectric film 10a including a buffer layer of an epitaxial film, a first electrode layer, a piezoelectric layer and a second electrode layer is formed by patterning on a substrate 5 a part of which constitutes the vibration plate 15, to form the piezoelectric element 10, and a back surface of the substrate is etched to form the individual liquid chamber 13. On the other hand, a substrate 14 provided with the communication hole 12 and the discharge port 11 is bonded to the substrate 5 provided with the individual liquid chamber 13, to form the liquid discharge head.

Thus, the liquid discharge head having an excellent piezoelectric characteristic and a large area can be obtained.

EXAMPLES

Examples of an epitaxial film, a piezoelectric element, a ferroelectric element, and a liquid discharge head according to the present invention will hereinafter be described specifically.

Example 1

Figure 4:
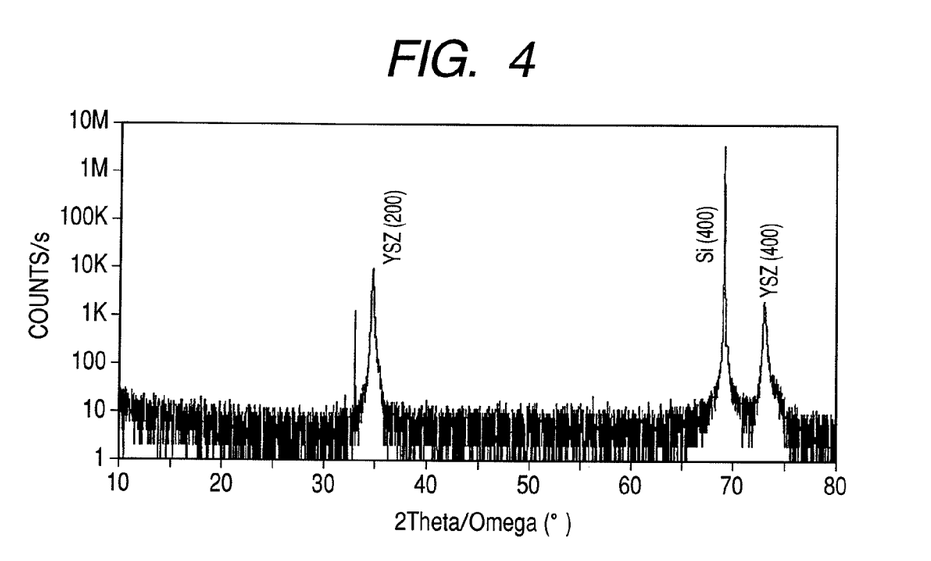
FIG. 4 is a diagram showing a profile of Example 1 of an epitaxial film according to the present invention by X-ray diffraction.

(Preparation of Epitaxial Film)
An epitaxial film was formed on an Si (100) single crystal substrate by use of an alloy target of 0.11Y-0.89Zr containing Y and Zr components and prepared by a vacuum melting process as follows.
(Initial Layer Film Formation)
A heating temperature was set to 624° C., and the substrate was heated for 30 minutes. After elapse of 30 minutes, an Ar gas was introduced, and a sputtering power supply was turned on to start pre-sputtering. At this time, a gas pressure and a sputtering power were set to 0.5 Pa and 2.96 W/cm², respectively. The pre-sputtering was performed for ten minutes, and then sputtering was performed for four seconds to form an initial layer.
(Oxide Layer Film Formation)
The initial layer was formed, and then the sputtering power supply was turned off to introduce an $O_2$ gas. The sputtering power supply was turned on again to start the pre-sputtering. At this time, a gas pressure and a sputtering power were set to 0.3 Pa and 5.92 W/cm², respectively, and a mixture gas of Ar and $O_2$ was used. The pre-sputtering was ended after 15 minutes elapsed from the start of the pre-sputtering of the initial layer, and then an oxide layer was formed.
(Evaluation of Epitaxial Film)
(Evaluation Based on XRD)
XRD (X'Pert MRD manufactured by Panalytical Co.) was performed to evaluate the resultant epitaxial film. $CuK\alpha_1$ radiation was used in an X-ray tube, an X-ray tube voltage was set to 45 kV, and an X-ray tube current was set to 40 mA. Measurement was performed by a parallel beam process. In an optical system, a hybrid mirror of Ge (220), a ½° slit for preventing vertical divergence and a 0.02 rad solar slit for preventing lateral divergence were used on an incident beam side. Moreover, a 0.09° collimator was used on a diffracted beam side. A result of the XRD pattern of the epitaxial film is shown in FIG. 4. A peak intensity of $Y_2O_3$—$ZrO_2$ (200) orientation was 9997 cps. A full width at half maximum was 0.7552°, and a lattice constant was 0.517 nm.

Moreover, during the initial layer film formation, an oxygen gas was introduced to prepare the epitaxial film. In the film, a peak intensity of $Y_2O_3$—$ZrO_2$ (200) orientation was 300 cps or less, and crystallinity was defective. In a case where a piezoelectric layer was provided on this film, the peak of the (200) orientation was not observed.
(Evaluation with Spectrum Ellipsometer)
Film thicknesses of an $SiO_2$ layer and an $Y_2O_3$—$ZrO_2$ layer on the Si substrate on which the epitaxial film was formed were measured with a spectroscopic ellipsometry (UVISEL manufactured by JOBIN YVON Co.). The thicknesses were 2.3 nm and 158.1 nm, respectively.

(Evaluation with XRF)
A composition of the resultant epitaxial film was measured with an XRF (X-ray fluorescence analysis Spectrometer, Magix Pro manufactured by Panalytical Co.). The composition was $0.020Y_2O_3$-$0.980ZrO_2$.
(Preparation of Piezoelectric Element)
On the epitaxial film, a $CeO_2$ layer and a first electrode layer of $LaNiO_3$ and $SrRuO_3$ were formed by sputtering, and a PZT (001) piezoelectric film was formed into a second electrode layer having a thickness of 3.0 μm on the first electrode layer, followed by evaporating an Au electrode to obtain the piezoelectric element.

Figure 5:
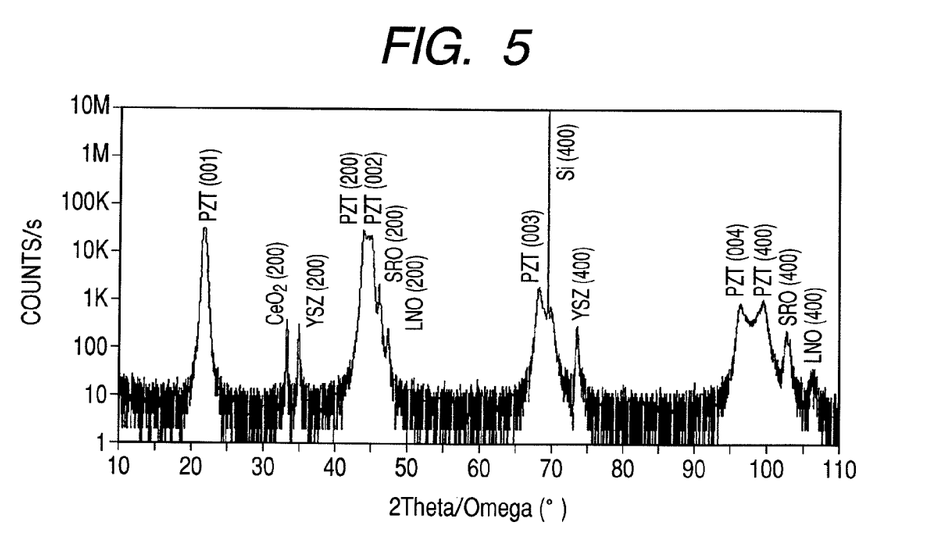
FIG. 5 is a diagram showing a profile of Example 1 of the piezoelectric element according to the present invention by X-ray diffraction.

The resultant piezoelectric element was measured with the XRD. A result of the XRD patterns of the piezoelectric element is shown in FIG. 5. The PZT layer was (001)/(100) epitaxially oriented, and a peak intensity of a YSZ layer of the epitaxial film was 400 cps.
(Liquid Discharge Head)
A liquid discharge head having a configuration of FIG. 1 was prepared using the above piezoelectric element to evaluate a liquid discharge characteristic. The head had satisfactory displacement and durability. In particular, the head taken from a four-inch Si substrate had a stabilized characteristic and an improved yield.

Example 2

(Preparation of Epitaxial Film)
An epitaxial film was formed on an Si (100) single crystal substrate by use of an alloy target of 0.14Y-0.86Zr containing Y and Zr components as follows.
(Initial Layer Film Formation)
A heating temperature was set to 635° C., and the substrate was heated for 30 minutes. After elapse of 30 minutes, an Ar gas was introduced, and a sputtering power supply was turned on to start pre-sputtering. At this time, a gas pressure and a sputtering power were set to 0.3 Pa and 2.96 W/cm², respectively. The pre-sputtering was performed for ten minutes, and then sputtering was performed for four seconds to form an initial layer.
(Oxide Layer Film Formation)
The initial layer was formed, and then the sputtering power supply was turned off to introduce an $O_2$ gas. The sputtering power supply was turned on again to start the pre-sputtering. At this time, a gas pressure and a sputtering power were set to 0.3 Pa and 5.92 W/cm², respectively, and a mixture gas of Ar and $O_2$ was used. The pre-sputtering was ended after 15 minutes elapsed from the start of the pre-sputtering of the initial layer, and then an oxide layer was formed.
(Evaluation of Epitaxial Film)
(Evaluation Based on XRD)
XRD measurement of the resultant epitaxial film was performed in the same manner as in Example 1. A peak intensity of $Y_2O_3$—$ZrO_2$ (200) orientation was 8652 cps. A full width at half maximum of the peak was 0.7787°, and a lattice constant was 0.517 nm.
(Evaluation with Spectroscopic Ellipsometry)
Film thicknesses of an $SiO_2$ layer and an $Y_2O_3$—$ZrO_2$ layer on the Si substrate on which the epitaxial film was formed were measured in the same manner as in Example 1. The thicknesses were 2.1 nm and 141.7 nm, respectively.
(Evaluation with XRF)
A composition of the resultant epitaxial film was measured in the same manner as in Example 1. The composition was $0.035Y_2O_3$-$0.965ZrO_2$.

Example 3

(Preparation of Epitaxial Film)

An epitaxial film was formed on an Si (100) single crystal substrate by use of an alloy target of 0.07Y-0.993Zr containing Y and Zr components as follows.

(Initial Layer Film Formation)

A heating temperature was set to 600° C., and the substrate was heated for 25 minutes. After elapse of 35 minutes, an Ar gas was introduced, and a sputtering power supply was turned on to start pre-sputtering. At this time, a gas pressure and a sputtering power were set to 0.5 Pa and 2.96 W/cm$^2$, respectively. The pre-sputtering was performed for ten minutes, and then sputtering was performed for four seconds to form an initial layer.

(Oxide Layer Film Formation)

The initial layer was formed, and then the sputtering power supply was turned off to introduce an O$_2$ gas. The sputtering power supply was turned on again to start the pre-sputtering. At this time, a gas pressure and a sputtering power were set to 0.5 Pa and 5.92 W/cm$^2$, respectively, and a mixture gas of Ar and O$_2$ was used. The pre-sputtering was ended after 15 minutes elapsed from the start of the pre-sputtering of the initial layer, and then an oxide layer was formed.

(Evaluation of Epitaxial Film)

(Evaluation Based on XRD)

XRD measurement of the resultant epitaxial film was performed in the same manner as in Example 1. A peak intensity of Y$_2$O$_3$—ZrO$_2$ (200) orientation was 8315 cps. A full width at half maximum of the peak was 0.7982°, and a lattice constant was 0.517 nm.

(Evaluation with Spectroscopic Ellipsometry)

Film thicknesses of an SiO$_2$ layer and an Y$_2$O$_3$—ZrO$_2$ layer on the Si substrate on which the epitaxial film was formed were measured in the same manner as in Example 1. The thicknesses were 2.2 nm and 168.3 nm, respectively.

(Evaluation with XRF)

A composition of the resultant epitaxial film was measured in the same manner as in Example 1. The composition was 0.010Y$_2$O$_3$-0.990ZrO$_2$.

Comparative Example 1

An epitaxial film was formed on an Si (100) single crystal substrate by use of an alloy target of 0.22Y-0.78Zr containing Y and Zr components.

(Initial Layer Film Formation)

A heating temperature was set to 800° C., and the substrate was heated for 25 minutes. After elapse of 35 minutes, an Ar gas was introduced, and a sputtering power supply was turned on to start pre-sputtering. At this time, a gas pressure and a sputtering power were set to 0.3 Pa and 2.96 W/cm$^2$, respectively. The pre-sputtering was performed for ten minutes, and then sputtering was performed for four seconds to form an initial layer.

(Oxide Layer Film Formation)

The initial layer was formed, and then the sputtering power supply was turned off to introduce an O$_2$ gas. The sputtering power supply was turned on again to start the pre-sputtering. At this time, a gas pressure and a sputtering power were set to 0.5 Pa and 2.76 W/cm$^2$, respectively. The pre-sputtering was ended after 15 minutes elapsed from the start of the pre-sputtering of the initial layer, and then an oxide layer was formed.

(Evaluation of Epitaxial Film)

(Evaluation Based on XRD)

XRD measurement of the resultant epitaxial film was performed in the same manner as in Example 1. A peak intensity of Y$_2$O$_3$—ZrO$_2$ (200) orientation was 1641 cps. A full width at half maximum of the peak was 0.9474°, and a lattice constant was 0.518 nm.

(Evaluation with Spectroscopic Ellipsometry)

Film thicknesses of an SiO$_2$ layer and an Y$_2$O$_3$—ZrO$_2$ layer on the Si substrate on which the epitaxial film was formed were measured in the same manner as in Example 1. The thicknesses were 2.2 nm and 117.3 nm, respectively.

(Evaluation with XRF)

Figure 6:
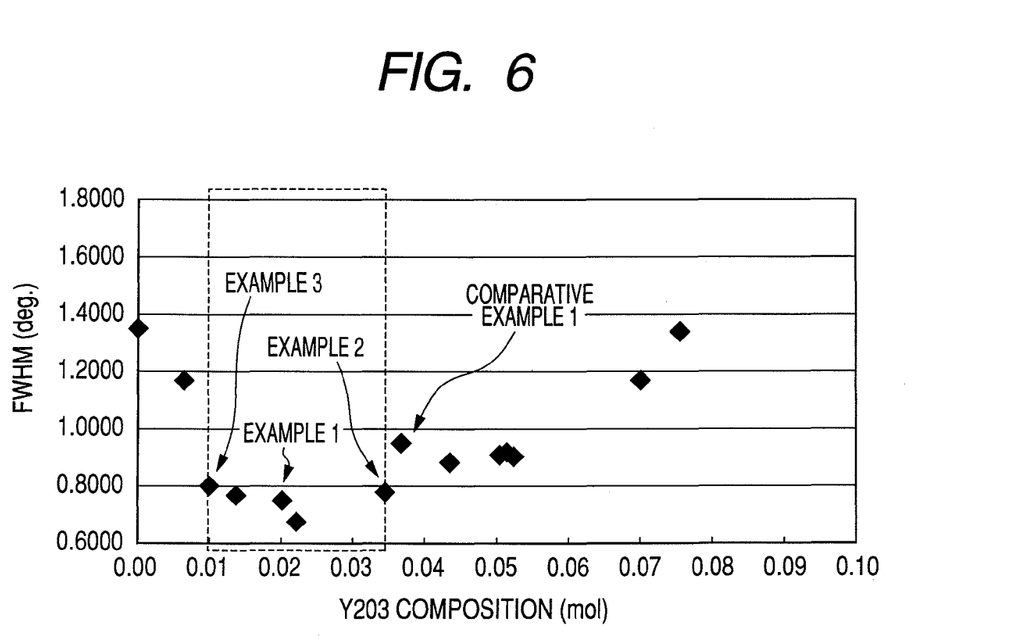
FIG. 6 is a diagram showing a relation between amounts of $Y_2O_3$ and full widths at half maximum of the epitaxial film according to the present invention.

A composition of the resultant epitaxial film was measured in the same manner as in Example 1. The composition was 0.037Y$_2$O$_3$-0.963ZrO$_2$. Here, a relation between an amount of Y$_2$O$_3$ and full width at half maximum of Y$_2$O$_3$—ZrO$_2$ (200) orientation is shown in FIG. 6. As seen from FIG. 6, when the amount of Y$_2$O$_3$ exceeds 0.035 mol, the full width at half maximum spreads in excess of 0.8°. When the amount is below 0.010 mol, the full width at half maximum also spreads in excess of 0.8°.

Comparative Example 2

An epitaxial film was formed on an Si (100) single crystal substrate by use of an alloy target of 0.32Y-0.68Zr containing Y and Zr components.

(Initial Layer Film Formation)

A heating temperature was set to 760° C., and the substrate was heated for 30 minutes. After elapse of 30 minutes, an Ar gas was introduced, and a sputtering power supply was turned on to start pre-sputtering. At this time, a gas pressure and a sputtering power were set to 1.0 Pa and 0.69 W/cm$^2$, respectively. The pre-sputtering was performed for ten minutes, and then sputtering was performed for four seconds to form an initial layer.

(Oxide Layer Film Formation)

The initial layer was formed, and then the sputtering power supply was turned off to introduce an O$_2$ gas. The sputtering power supply was turned on again to start the pre-sputtering. At this time, a gas pressure and a sputtering power were set to 1.0 Pa and 2.76 W/cm$^2$, respectively. The pre-sputtering was ended after 15 minutes elapsed from the start of the pre-sputtering of the initial layer, and then an oxide layer was formed.

(Evaluation of Epitaxial Film)

(Evaluation Based on XRD)

XRD measurement of the resultant epitaxial film was performed in the same manner as in Example 1. A peak intensity of Y$_2$O$_3$—ZrO$_2$ (200) orientation was 142.7 cps, and a full width at half maximum of the peak and a lattice constant could not be measured.

(Evaluation with Spectroscopic Ellipsometry)

Film thicknesses of an SiO$_2$ layer and an Y$_2$O$_3$—ZrO$_2$ layer on the Si substrate on which the epitaxial film was formed were measured in the same manner as in Example 1. The thicknesses were 2.3 nm and 158.1 nm, respectively.

(Evaluation with XRF)

A composition of the resultant epitaxial film was measured in the same manner as in Example 1. The composition was 0.113Y$_2$O$_3$-0.887ZrO$_2$.

Comparative Example 3

An epitaxial film was formed on an Si (100) single crystal substrate by use of a mounted target in which four 2.5 mm square Y metal chips were radially arranged at a position of 15 mm from the center on a metal Zr.

(Initial Layer Film Formation)

A heating temperature was set to 624° C., and the substrate was heated for 30 minutes. After elapse of 30 minutes, an Ar gas was introduced, and a sputtering power supply was turned on to start pre-sputtering. At this time, a gas pressure and a sputtering power were set to 1.3 Pa and 2.96 W/cm², respectively. The pre-sputtering was performed for ten minutes, and then sputtering was performed for six seconds to form an initial layer.

(Oxide Layer Film Formation)

The initial layer was formed, and then the sputtering power supply was turned off to introduce an $O_2$ gas. The sputtering power supply was turned on again to start the pre-sputtering. At this time, a gas pressure and a sputtering power were set to 0.9 Pa and 5.92 W/cm², respectively, and a mixture gas of Ar and $O_2$ was used. The pre-sputtering was ended after 15 minutes elapsed from the start of the pre-sputtering of the initial layer, and then an oxide layer was formed.

(Evaluation of Epitaxial Film)

(Evaluation Based on XRD)

XRD measurement of the resultant epitaxial film was performed in the same manner as in Example 1. A peak intensity of $Y_2O_3$—$ZrO_2$ (002) orientation was 273.8 cps. A full width at half maximum of the peak was 1.8759°, and a lattice constant was 0.520 nm.

(Evaluation with XRF)

A composition of the resultant epitaxial film was measured in the same manner as in Example 1. The composition was $0.208Y_2O_3$-$0.792ZrO_2$. The thickness of the $Y_2O_3$—$ZrO_2$ layer was of 117.3 nm.

Comparative Example 4

An epitaxial film was formed on an Si (100) single crystal substrate by use of a mounted target in which four 2.5 mm square Y metal chips were radially arranged at a position of 15 mm from the center on a metal Zr.

(Initial Layer Film Formation)

An initial layer was formed in the same manner as in Comparative Example 2 except that a heating temperature of the substrate was set to 900° C.

(Oxide Layer Film Formation)

The initial layer was formed, and then the sputtering power supply was turned off to introduce an $O_2$ gas. The sputtering power supply was turned on again to start the pre-sputtering. At this time, a gas pressure and a sputtering power were set to 1.3 Pa and 5.92 W/cm², respectively. The pre-sputtering was ended after 15 minutes elapsed from the start of the pre-sputtering of the initial layer, and then an oxide layer was formed.

(Evaluation of Epitaxial Film)

(Evaluation Based on XRD)

XRD measurement of the resultant epitaxial film was performed in the same manner as in Example 1. A peak intensity of $Y_2O_3$—$ZrO_2$ (002) orientation could not be confirmed, and the film was not crystallized. The film seemed to have white turbidity.

(Evaluation with XRF)

A composition of the resultant epitaxial film was measured in the same manner as in Example 1. The composition was $0.14Y_2O_3$-$0.862ZrO_2$. The thickness of the $Y_2O_3$—$ZrO_2$ layer was 104.8 nm.

Example 4

(Preparation of Ferroelectric Element)

In the same manner as in Example 1, a Pt (111) epitaxial film was formed on an epitaxial film made of YSZ, and an $SrRuO_3$ (111) film was formed on the epitaxial film. On this film, PZT was formed into a film, whereby a (111) epitaxial film having satisfactory crystallinity could be obtained. A film thickness was set to 150 nm. A residual polarization Pr of the film is close to 40 µC/cm², and has a satisfactory repetition durability.

As seen from the above result, according to the manufacturing method of the epitaxial film of the present invention, the epitaxial film having excellent crystallinity on the Si substrate as compared with a bulk single crystal. The piezoelectric element and ferroelectric element having excellent characteristics and having a large area can be obtained by use of the epitaxial film in the buffer layer. The liquid discharge head having a large amount of liquid to be discharged, capable of discharging the liquid at a high speed and having a large area can be prepared.

This application claims the benefit of Japanese Patent Application No. 2007-094116, filed Mar. 30, 2007, which is hereby incorporated by reference herein in its entirety.

The invention claimed is:

1. A manufacturing method of an epitaxial film, comprising:

forming the epitaxial film on an $SiO_2$ layer with a film thickness of 1.0 nm or more to 10 nm or less provided on a surface of a heated Si substrate by use of a metal target represented by the following composition formula:

$$yA(1-y)B \qquad (1),$$

in which A is one or more elements selected from the group consisting of rare earth elements including Y and Sc, B is Zr, and y is a numeric value of 0.03 or more to 0.20 or less in only an inert gas; and successively forming the epitaxial film by use of the metal target in an oxygen-containing gas, wherein the epitaxial film is represented by the following composition formula:

$$xA_2O_3\text{-}(1-x)BO_2 \qquad (2),$$

in which A and B are respectively same elements as A and B of the composition formula (1), and x is a numeric value of 0.010 or more to 0.035 or less.

2. The manufacturing method of the epitaxial film according to claim 1, wherein the epitaxial film is represented by the composition formula (2) in which A is Y, and has a crystal structure with a lattice constant of 0.515 nm or more to 0.518 nm or less.

3. The manufacturing method of the epitaxial film according to claim 1, wherein a sputtering process is used in the film formation.

4. The manufacturing method of the epitaxial film according to claim 1, wherein the Si substrate is heated to 400° C. or more to 760° C. or less.

5. A manufacturing method of an epitaxial element, comprising:

forming an epitaxial film on an Si substrate by use of the manufacturing method of the epitaxial film according to claim 1;

providing a first electrode layer;

providing, on the Si substrate, a piezoelectric layer of (100) orientation, (001) orientation, (110) orientation, (111) orientation or orientation in which the (100) orientation and the (001) orientation are mixedly present; and providing a second electrode layer.

6. A manufacturing method of a ferroelectric element, comprising:
forming an epitaxial film on a Si substrate by use of the manufacturing method of the epitaxial film according to claim 1;
providing a first electrode layer;
providing a ferroelectric layer of (111) orientation on the Si substrate; and
providing a second electrode layer.

7. An epitaxial film which is formed on an Si substrate and which is represented by the following composition formula:

$$xA_2O_3-(1-x)BO_2 \qquad (2),$$

in which A is one or more atoms of elements selected from the group consisting of rare earth elements including Y and Sc, B is Zr, and x is a numeric value of 0.010 or more to 0.035 or less, and the full width of half maximum is no more than 0.8° at (200) orientation.

8. The epitaxial film according to claim 7, wherein a lattice constant is in a range of 0.515 nm or more to 0.518 nm or less.

9. The epitaxial film according to claim 7, wherein a film thickness is in a range of 1.0 nm or more and 500 nm or less.

10. A piezoelectric element which has a first electrode layer, a piezoelectric layer and a second electrode layer in this order on an Si substrate, the piezoelectric element further comprising, between the Si substrate and the first electrode layer, an epitaxial film represented by the following composition formula:

$$xA_2O_3-(1-x)BO_2 \qquad (2),$$

in which A is one or more atoms of elements selected from the group consisting of rare earth elements such as Y and Sc, B is Zr, and x is a numeric value of 0.010 or more to 0.035 or less, and the full width of half maximum is no more than 0.8° at (200) orientation.

11. The piezoelectric element according to claim 10, wherein the piezoelectric layer has, with respect to the Si substrate, (100) orientation, (001) orientation, (110) orientation, (111) orientation, or orientation in which the (100) orientation and the (001) orientation are mixedly present.

12. The piezoelectric element according to claim 10, wherein a film thickness of the piezoelectric layer is in a range of 1.0 nm or more to 500 nm or less.

13. A liquid discharge head having the electrode layer according to claim 10 and adapted to discharge a liquid by use of the piezoelectric element.

14. A ferroelectric element which has a first electrode layer, a ferroelectric layer and a second electrode layer in this order on an Si substrate, the ferroelectric element further comprising, between the Si substrate and the first electrode layer, an epitaxial film represented by the following composition formula:

$$xA_2O_3-(1-x)BO_2 \qquad (2),$$

in which A is one or more atoms of elements selected from the group consisting of rare earth elements such as Y and Sc, B is Zr, and x is a numeric value of 0.010 or more to 0.035 or less, and the full width of half maximum is no more than 0.8° at (200) orientation.

15. The ferroelectric element according to claim 14, wherein the ferroelectric layer has (111) orientation with respect to the Si substrate.

* * * * *